United States Patent
Hsu et al.

(10) Patent No.: US 6,924,527 B2
(45) Date of Patent: Aug. 2, 2005

(54) SPLIT GATE FLASH MEMORY CELL STRUCTURE AND METHOD OF MANUFACTURING THE SAME

(75) Inventors: Ching-Hsiang Hsu, Hsin-Chu (TW); Evans Ching-Song Yang, Chan-Hua (TW); Len-Yi Leu, Hsin-Chu (TW); Bin-Shing Chen, Hsin-Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/383,527

(22) Filed: Mar. 10, 2003

(65) Prior Publication Data

US 2003/0137002 A1 Jul. 24, 2003

Related U.S. Application Data

(63) Continuation of application No. 09/941,657, filed on Aug. 30, 2001, now abandoned.

(51) Int. Cl.$^7$ .................... H01L 29/788; H01L 27/108
(52) U.S. Cl. .................... 257/316; 257/315; 257/300
(58) Field of Search ............... 257/300, 316, 257/315, 314

(56) References Cited

U.S. PATENT DOCUMENTS

| | | | |
|---|---|---|---|
| 5,029,130 A | 7/1991 | Yeh | |
| 5,045,488 A * | 9/1991 | Yeh | 438/257 |
| 5,202,850 A | 4/1993 | Jenq | |
| 5,278,087 A | 1/1994 | Jenq | |
| 5,572,054 A | 11/1996 | Wang | |
| 6,359,303 B1 * | 3/2002 | Kanamori | 257/314 |

* cited by examiner

Primary Examiner—Amir Zarabian
Assistant Examiner—Kiesha Rose
(74) Attorney, Agent, or Firm—Finnegan, Henderson, Farabow, Garrett & Dunner, L.L.P.

(57) ABSTRACT

A non-volatile memory cell that includes a semiconductor substrate, a well region implanted with a first-type dopant formed in the semiconductor substrate, a first doped region implanted with a second-type dopant formed in the semiconductor substrate, a second doped region, formed spaced-apart from the first doped region, implanted with a second-type dopant formed in the semiconductor substrate, the second doped region further including a third region implanted with the first-type dopant, a first dielectric layer disposed over the semiconductor substrate, a floating gate disposed over the first dielectric layer and extending over the well region and a portion of the second doped region, a second dielectric layer disposed over the floating gate, and a control gate disposed over the first dielectric layer and the second dielectric layer.

18 Claims, 4 Drawing Sheets

SPLIT GATE FLASH MEMORY CELL STRUCTURE AND METHOD OF MANUFACTURING THE SAME

Continuation Application under 37 C.F.R. § 1.53(b) of prior application Ser. No. 09/941,657 filed Aug. 30, 2001, now abandoned.

BACKGROUND OF THE INVENTION

1. Field of the Invention

The present invention pertains in general to a non-volatile memory cell structure and method of manufacturing the same, and more particularly, to a split-gate non-volatile memory cell and method of multilevel self-convergent programming of the non-volatile memory cell.

2. Description of the Related Art

In a conventional split gate flash memory or Electrically Erasable Programmable Read-Only-Memory ("EEPROM"), commonly known as a non-volatile memory, programming may be achieved by storing electrons in the floating gate of the memory cell. Under certain bias conditions, electrons in a semiconductor substrate can tunnel through a thin oxide layer disposed between the floating gate and the semiconductor substrate to allow for charge storage in the floating gate. The tunneling electrons may be created by a conventional hot-electron injection scheme or a Fowler-Nordheim tunneling scheme.

In a conventional hot electron injection scheme, a high voltage is applied to the control gate (word line) of a memory cell, and a low or zero voltage is applied to the drain (bit line). When electrons in a channel region disposed between the source and drain regions of the cell attain an energy level higher than the barrier potential of the thin oxide layer disposed between the channel and floating gate, some of the electrons will tunnel through the thin oxide layer and inject into the floating gate. However, not all electrons in the channel region will attain an energy sufficient to tunnel through the thin oxide layer. The probability that an electron will tunnel through the thin oxide layer is proportional to the voltage difference between the control gate and drain region.

In addition, the number of electron charges proportional to the voltage difference between the control gate and drain will appear on the floating gate. These charges impose an electric field on the channel region beneath the floating gate. This electric field is known as the threshold voltage. The threshold voltage determines whether a memory cell is "storing" any data or value. For example, a logic value of "0" may be represented by setting a high threshold voltage and a logic value of "1" may be represented by a low threshold voltage.

FIG. 1 shows a cross-sectional view of a conventional split gate flash memory cell 10. Memory cell 10 includes a p-well 12, a source 14, a drain 16, a floating gate 18 and a control gate 20. Drain 16 also includes a lightly-doped n-region 16-1 and a heavier-doped n-region 16-2 to form an N/N+ drain. Drain 16 is connected to a bit line (BL), source 14 is connected to a source line (SL), and control gate 20 is connected to a word line (WL). In general, different threshold voltages of memory cell 10 may be created by providing a fixed voltage to control gate 20 and modulating the voltage provided to drain 16.

Memory cell 10 may be erased with the Fowler-Nordheim tunneling scheme. Under this scheme, a high voltage, e.g., 14 volts, is provided to control gate 20, and 0 (zero) volt is provided to drain 16, source 14 and p-well 12. Under these conditions, electrons stored in floating gate 18, composed of polysilicon material, tunnel through a dielectric layer 22 to control gate 20, also composed of polysilicon material. Therefore, the Fowler-Nordheim tunneling scheme is also known as "poly-to-poly tunneling" scheme. During read operations, approximately 3 volts are provided to control gate 20, 2 volts are provided to drain 16, and source 14 and p-well 12 are grounded. To achieve source-side hot electron injection scheme for programming, a threshold voltage, e.g., 1 volt, is provided to control gate 20, a high voltage, e.g., 11 volts, is provided to drain 16, and source 14 and p-well 12 are grounded.

To determine whether a memory cell has been programmed to the desired value, the conventional flash memory cell may be programmed for a predetermined time period. The value of the memory cell is then verified, and the memory cell may be repeatedly programmed until the desired value has been reached. This is an iterative process. Alternatively, a small voltage may be applied to bit line BL to verify the potential on the floating gate. This process continues until the potential on the floating gate has reached the desired value. Regardless of what method is used, the conventional programming techniques are time-consuming and difficult to control due to repeated programming and verification of the memory cell.

Furthermore, the conventional split gate flash memory cell only performs a one-bit programming operation, e.g., "0" or "1". However, due to an increased demand for a large memory programming capacity together with a rapid data-reading capability, it is desirable that the memory cell performs multilevel programming operations and be able to rapidly read the stored data.

SUMMARY OF THE INVENTION

Accordingly, the present invention is directed to a novel split gate non-volatile memory cell capable of multilevel programming and a method of manufacturing the split gate non-volatile memory cell that substantially obviate one or more problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided a non-volatile memory cell that includes a semiconductor substrate, a well region implanted with a first-type dopant formed in the semiconductor substrate, a first doped region implanted with a second-type dopant formed in the semiconductor substrate, a second doped region, formed spaced-apart from the first doped region, implanted with a second-type dopant formed in the semiconductor substrate, the second doped region further including a third region implanted with the first-type dopant, a first dielectric layer disposed over the semiconductor substrate, a floating gate disposed over the first dielectric layer and extending over the well region and a portion of the second doped region, a second dielectric layer disposed over the floating gate, and a control gate disposed over the first dielectric layer and the second dielectric layer.

In one aspect of the invention, the second doped region forms a parasitic transistor with the well region.

In another aspect of the invention, the parasitic transistor conducts when a potential of the floating gate reaches a predetermined level.

In yet another aspect of the invention, the parasitic transistor amplifies output signals of the memory cell.

In still another aspect of the invention, the memory cell further includes a metal contact formed over the second doped region, wherein the metal contact is electrically coupled to the third region and isolated from the second doped region.

Also in accordance with the present invention, there is provided a non-volatile memory product formed on a semiconductor substrate that includes a memory cell having a well region doped with a first-type dopant, a drain region having a first region doped with a first-type dopant and a second region doped with a second-type dopant, wherein the second region is contiguous with the well region, a source region formed spaced-apart from the drain region and contiguous with the well region, a floating gate disposed over the well region, drain region and source region, and a control gate formed over the floating gate. The memory product also includes a parasitic transistor formed inside the memory cell, wherein the memory cell attains a self-convergent state during programming of the memory cell.

In one aspect of the invention, the drain region of the memory cell is provided with a plurality of voltage levels to obtain a plurality of threshold voltages in the memory cell.

Further in accordance with the present invention, there is provided a non-volatile memory product that includes a semiconductor substrate having a well region implanted with a first-type dopant, a first doped region implanted with a second-type dopant, and a second doped region, formed spaced-apart from the first doped region, implanted with a second-type dopant, the second doped region including a third region implanted with the first-type dopant, wherein the second doped region and the well region form a parasitic transistor. The non-volatile memory product also includes a floating gate disposed over the semiconductor substrate and a portion of the second doped region, a control gate disposed over a portion of the floating gate, a first voltage source for providing a first voltage to the second doped region, and a second voltage source for providing a second voltage to the control gate, wherein during programming of the memory cell, the first voltage is greater than the second voltage, and wherein upon reaching a predetermined programming level, the parasitic transistor conducts terminate programming.

In one aspect of the invention, the parasitic transistor conducts to discharge the first voltage to a level substantially equal to that of the second voltage to terminate programming.

Additionally in accordance with the present invention, there is provided a method of self-convergence in programming of a non-volatile memory cell that includes providing a non-volatile memory cell including a semiconductor substrate having a well region, providing a parasitic transistor in the semiconductor substrate, providing a first voltage sufficient to induce programming of the memory cell, providing a floating gate over the semiconductor substrate, providing a control gate over the semiconductor substrate and the floating gate, providing a second voltage to the control gate, wherein the first voltage is larger than the second voltage, and providing a predetermined programming parameter in the floating gate, wherein upon reaching the predetermined programming parameter, the parasitic transistor terminates programming.

In one aspect of the invention, the step of providing a parasitic transistor in the semiconductor substrate includes providing a first doped region in the semiconductor substrate, providing a second doped region in the first doped region having a first-type dopant, and providing a third doped region in the first doped region having a second-type dopant, wherein the first doped region and the well region forming a parasitic transistor.

Also in accordance with the present invention, there is provided a method of multiple self-convergent states during programming of a non-volatile memory cell that includes providing a non-volatile memory cell including a semiconductor substrate having a well region, providing a parasitic transistor in the semiconductor substrate, providing a first voltage sufficient to induce programming of the memory cell, providing a floating gate over the semiconductor substrate, providing a control gate over the semiconductor substrate and the floating gate, providing a second voltage to the control gate, wherein the first voltage is larger than the second voltage, and providing a predetermined programming parameter in the floating gate, wherein upon reaching the predetermined programming parameter, the parasitic transistor conducts to terminate programming.

Additionally in accordance with the present invention, there is provided a method of forming a non-volatile memory cell that includes forming a semiconductor substrate, forming a well-region with a first-type dopant within the semiconductor substrate, forming a floating gate, forming a first spaced-apart region with a second-type dopant, forming a region within the first spaced-apart region with the first-type dopant, forming a second spaced-apart region with a second-type dopant, and forming a control gate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Figure 1:
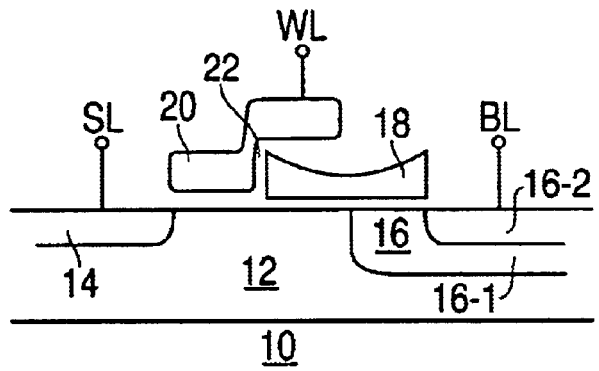
FIG. 1 is a cross-sectional view of a conventional split gate flash memory array.
Figure 2:
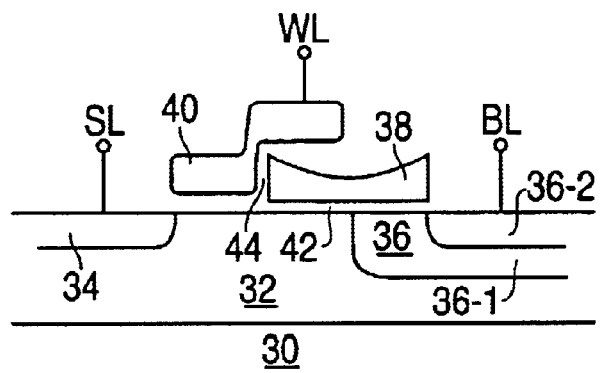
FIG. 2 is a cross-sectional view of a split gate non-volatile memory cell in accordance with the present invention.

In accordance with the present invention, there is provided a split gate non-volatile memory cell capable of multilevel programming and rapid reading of stored data. FIG. 2 is a cross-sectional view of a split gate non-volatile memory cell in accordance with the present invention. Although the non-volatile memory cell shown in FIG. 2 is manufactured on a p-well substrate, one skilled in the art would understand that the non-volatile memory cell of the present invention may be manufactured on an n-well substrate and still attain the objectives of the present invention.

Referring to FIG. 2, a split gate flash memory cell 30 includes a p-well 32, a source region 34, a drain region 36, a floating gate 38, and a control gate 40. Drain region 36 further includes an n-region 36-1 doped with an n-type dopant and a p+-region 36-2 formed by doping a portion of n-region 36-1 with a p-type dopant. A first dielectric layer 42 is disposed over p-well 32, source region 34 and drain region 36. Floating gate 38 is disposed over first dielectric layer 42 and extends over a portion of a channel region (not numbered) disposed between source region 34 and drain region 36. Floating gate 38 also extends over a portion of drain region 36. A second dielectric layer 44, having a first and second connected sections (not numbered), is disposed over and around floating gate 38. Control gate 40 is disposed over a portion of first dielectric layer 42 and a portion of second dielectric layer 44, and further extends over a portion of source region 34.

Figure 3:
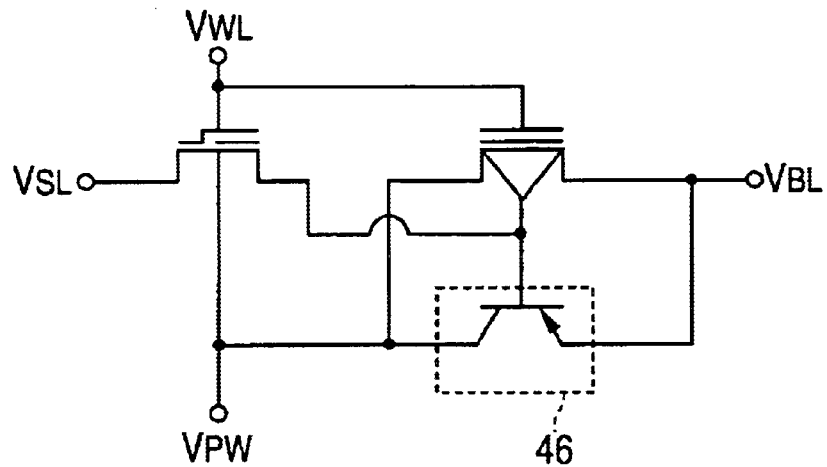
FIG. 3 is a circuit diagram showing an equivalent circuit to the non-volatile memory cell shown in FIG. 2.

Source region 34 is connected to a source line SL, control gate 40 is connected to a word line WL, and drain 36 is connected to a bit line BL. A metal contact (not shown) connecting drain region 36 to bit line BL comes into contact only with p+-region 36-2. N-region 36-1 of drain region 36 is therefore floating. As a result, drain region 36, with p+-region 36-2 and n-region 36-1, forms a parasitic PNP transistor with p-well 32. FIG. 3 shows an equivalent circuit of memory cell 30, including an equivalent circuit of the parasitic PNP transistor 46. Parasitic transistor 46 functions to amplify output signals from memory cell 30, thereby obviating a need to design a peripheral circuit to read the data stored in memory cell 30.

In operation, drain region 36 is provided with a bit line voltage ($V_{BL}$), source region 34 is provided with a source line voltage ($V_{SL}$), and control gate 40 is provided with a word line voltage ($V_{WL}$). Memory cell 40 of the present invention is erased by providing a large voltage, e.g., 14 volts, to control gate 40, and zero volts to each of source region 34, drain region 36 and p-well 32 to induce Fowler-Nordheim tunneling. Electrons stored in floating gate 38 tunnel through second dielectric layer 44 to control gate 40. In a read operation, a voltage of 3 volts is provided to control gate 40, a threshold voltage, e.g., 1 volt, is provided to drain region 36, and source region 34 and p-well are grounded.

To program memory cell 40, a large bit line voltage, e.g., 11 volts, is provided to drain region 36 and a threshold voltage, e.g., 1 volt, is provided to control gate 40. Source region 34 and p-well 32 are grounded. Under these conditions, some electrons in the channel region migrating from source region 34 to drain region 36 are injected into floating gate 38. The programmed potential of floating gate 38 is determined by the word line voltage ($V_{WL}$), the bit line voltage ($V_{BL}$), the voltage on the p-well ($V_{pw}$), and the voltage programmed into the floating gate during the programming operation. In accordance with the present invention, $V_{WL}$ and $V_{pw}$ are fixed and, thus, the bit line voltage primarily determines the potential on floating gate 38. Further, the potential of floating gate 38 determines whether the PN junction (not numbered) between p-well 32 and n-region 36-1 of drain region 36 is turned on. In other words, the potential of floating gate 38 determines whether parasitic transistor 46 is turned on. When the potential of floating gate 38 reaches its predetermined value, parasitic transistor 46 is turned on, or conducts, to discharge the bit line voltage ($V_{BL}$) to the level of the p-well voltage ($V_{PW}$), to stop the programming operation.

Specifically, during programming, the bit line voltage, e.g., 11 volts, is higher than that of the world line voltage, e.g., 1 volt. Under these conditions, the PN junction between n-region 36-1 and p+-region 36-2 in drain region 36 is turned on, but the junction between n-region 36-1 of drain region 36 and p-well 32 is not. When the potential of floating gate 38 reaches a predetermined level, parasitic transistor 46 is turned on, discharging the bit line voltage to the voltage level on p-well 32. Under these conditions, source-side hot electron injection scheme cannot be sustained, and programming stops. Therefore, memory cell 40 has reached a first self-convergence state.

By applying different bit line voltages to set up different predetermined potential levels on the floating gate, the memory cell of the present invention may be programmed to obtain a plurality of self-convergent states. Furthermore, whether transistor 46 is turned on depends on the potential of floating gate 38. Thus, the memory cell of the present invention obviates the need to add other steps to verify the potential on the floating gate, thus simplifying programming operations and reducing programming time.

Figure 4:
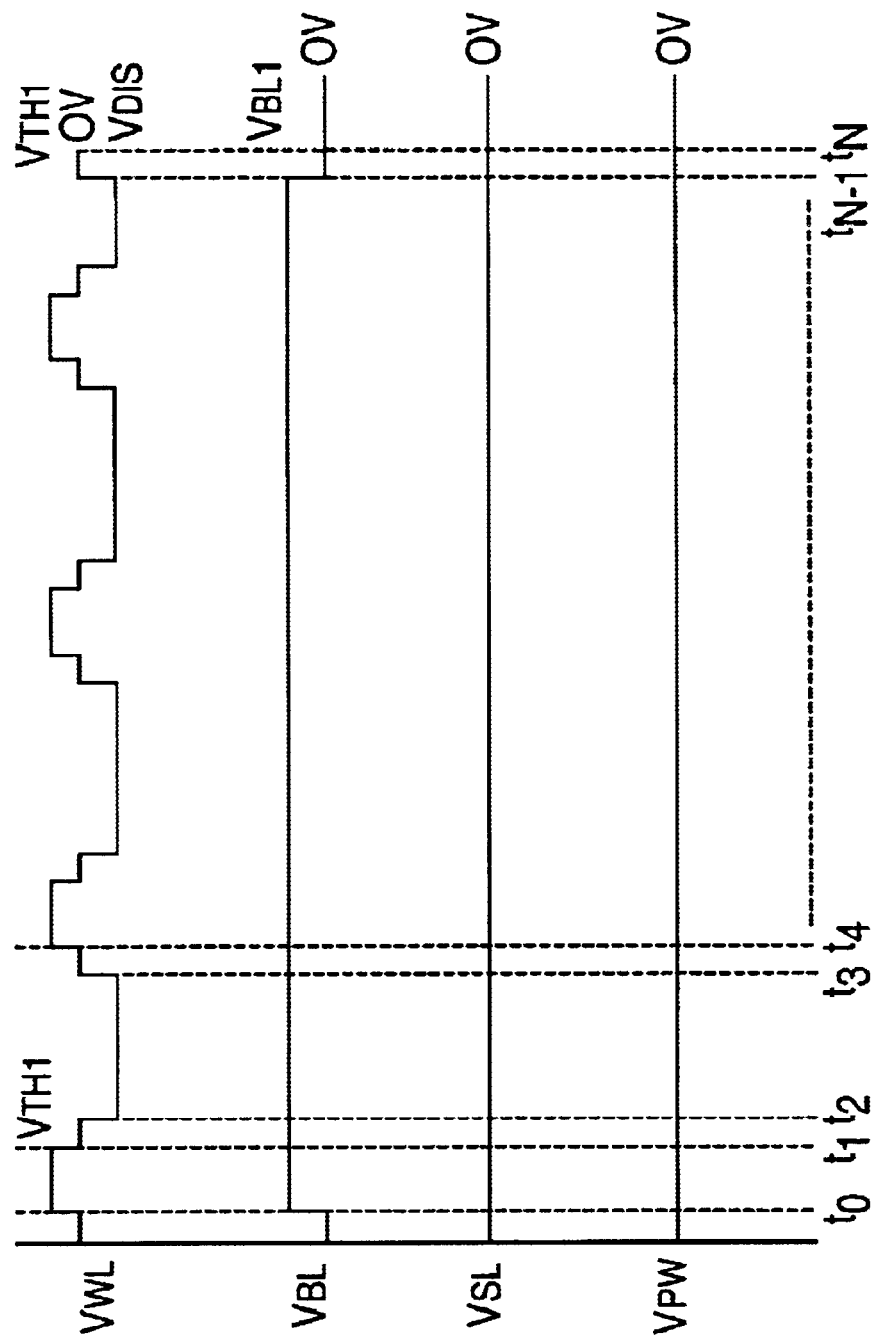
FIG. 4 is a timing diagram showing the voltages applied to the control gate, drain region, source region and p-well region of the non-volatile memory cell in accordance with the present invention.

A detailed description of multilevel programming and self-convergence is explained by reference to FIG. 4. FIG. 4 is a timing diagram showing various voltages applied to the control gate, drain region, source region and p-well region of the memory cell. Referring to FIG. 4, programming voltage waveforms of $V_{WL}$, $V_{BL}$, $V_{SL}$ and $V_{PW}$ are shown. The word line voltage $V_{WL}$ is a step waveform having voltages of $V_{TH1}$, 0 volt, and $V_{DIS}$ repeated over a plurality of cycles from time $t_0$ to $t_N$. The bit line voltage $V_{BL}$ is a fixed voltage at $V_{BL1}$ from time $t_0$ to $t_{N-1}$. The source voltage $V_{SL}$ and p-well voltage $V_{PW}$ are at 0 volt for the duration of the programming operation. Each cycle of the word-line voltage $V_{WL}$ represents a complete programming cycle of the floating gate. After the voltage of the floating gate reaches a predetermined value, parasitic transistor 46 is turned on, discharging the bit line voltage $V_{BL}$ to ground and the programming operation stops.

During the time period $t_0$–$t_1$, the word line voltage $V_{WL}$ is at a first threshold voltage $V_{TH1}$ and the bit line voltage $V_{BL}$ is fixed at a first bit line voltage ($V_{BL1}$). Under these conditions, electrons are injected into the floating gate to program the memory cell. However, since the voltage provided to the PN junction of the parasitic transistor that turns on the junction should be negative (e.g., –0.7V), the voltage $V_{WL}$ drops to 0V at time $t_1$ and then to a $V_{DIS}$, a negative voltage, at time $t_2$, after the floating gate has been programmed. The voltage $V_{DIS}$ should be smaller than the junction leakage voltage.

The negative voltage $V_{DIS}$ is coupled to the floating gate from $t_3$ to $t_4$, and the word line voltage $V_{WL}$ is again brought back to $V_{TH1}$. Programming of the floating gate resumes at time $t_4$. The cycle of programming, coupling and re-programming repeats until the potential of the floating gate reaches the predetermined value. At this time (e.g., at $t_{N-1}$), electrons are no longer being injected into the floating gate and the PN junction of parasitic transistor 46 is turned on, resulting in a discharge of the voltage on the bit line until the bit line voltage drops to a level equal to the voltage of the p-well, approximately 0 volts. At this point, no electrons can be injected into the floating gate and the programming operation stops. The memory cell has arrived at a self-convergent state.

By applying a second bit line voltage, e.g., $V_{BL2}$, a second threshold voltage $V_{TH2}$ may be obtained such that the memory cell may attain a second self-convergent state. It therefore follows that by applying different bit line voltages, different self-convergent states of the memory cells may be obtained. Therefore, memory cells of the present invention may be programmed with more than one bit of data.

Figure 5A:
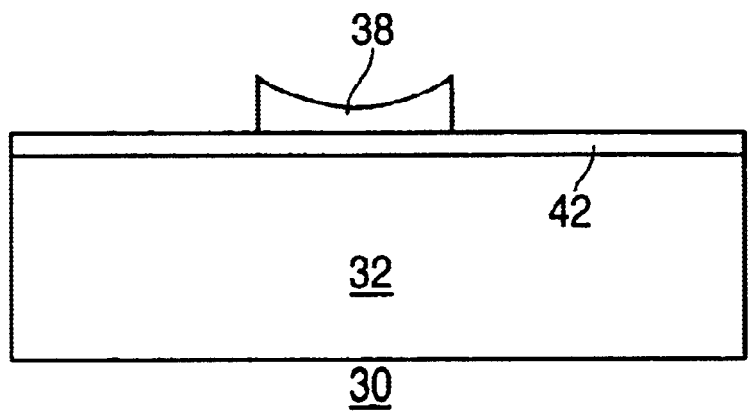
FIG. 5A to FIG. 5E are cross-sectional views of a method for manufacturing the split gate non-volatile memory cell in accordance with the present invention.
Figure 5B:
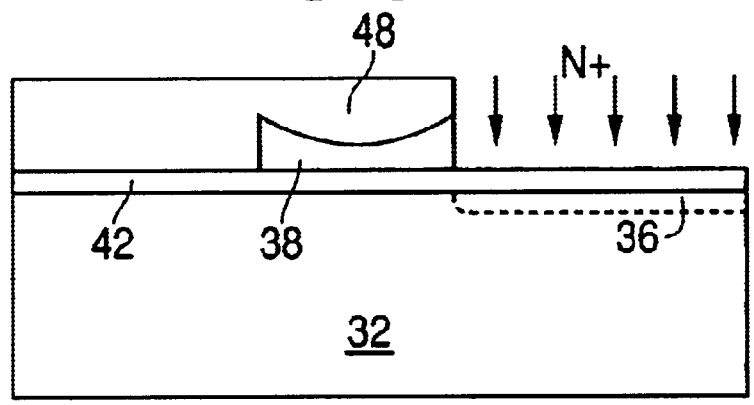
Figure 5C:
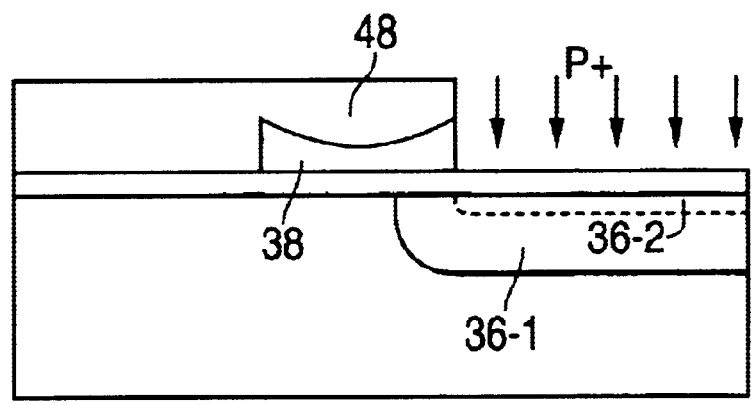

FIG. 5A to FIG. 5E are cross-sectional views of a method for manufacturing the split gate flash memory cell structure in accordance with the present invention. Referring to FIG. 5A, a convention manufacturing process may be used to form a p-well 32, a dielectric layer 42 disposed over p-well 32, and a floating gate 38 formed over the dielectric layer 42. Referring to FIG. 5B, a first photoresist 48 is then deposited, patterned and developed to mask floating gate 38 and a region to be formed as a source region. An n-type impurity, e.g., phosphorous, is implanted into unmasked region to form a drain region 36. As shown in FIG. 5C, implanted n-type impurity diffuses into p-well 32 and under a portion of floating gate 38.

Figure 5D:
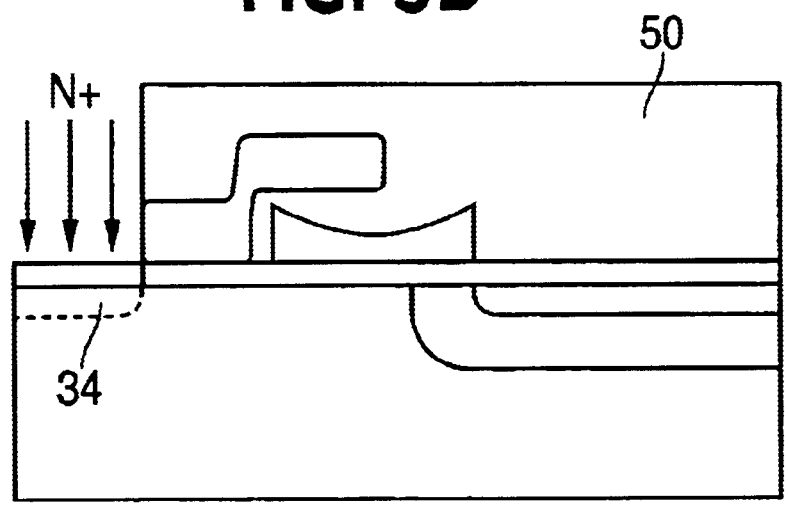
Figure 5E:
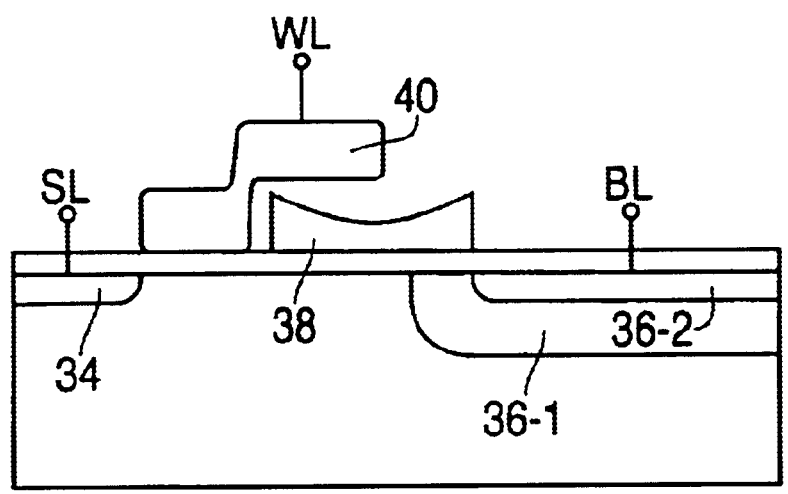

Referring to FIG. 5C, using the same photoresist 48 as a mask, a p-type impurity, e.g., $BF_2$, is implanted into drain region 36 to form a p-region 36-2. Drain region 36 therefore includes an n-region 36-1 and a p-region 36-2. Photoresist 48 is then removed. Referring to FIG. 5D, a second photoresist 50 is deposited, patterned and developed to mask floating gate 38 and drain region 36. An n-type impurity, e.g., As, is implanted into regions not masked by photoresist 48 to form a source region 34. Photoresist 50 is then removed. Referring to FIG. 5E, conventional process steps follow to form a control gate 40, and metal contacts for the source line SL, word line WL, and bit line BL.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A non-volatile memory cell, comprising:
    a semiconductor substrate;
    a well region implanted with a first-type dopant formed in the semiconductor substrate;
    a first doped region implanted with a second-type dopant formed in the semiconductor substrate;
    a second doped region, formed spaced-apart from the first doped region, implanted with the second-type dopant formed in the semiconductor substrate, the second doped region further including a third region implanted with the first-type dopant, wherein the well region, the second doped region, and the third region are arranged to form a parasitic transistor;
    a first dielectric layer disposed over the semiconductor substrate;
    a floating gate disposed over the first dielectric layer and extending over the well region and a portion of the second doped region;
    a second dielectric layer disposed over the floating gate; and
    a control gate disposed over the first dielectric layer and the second dielectric layer.

2. The memory cell as claimed in claim 1, wherein the second doped region is a drain region and the first doped region is a source region.

3. The memory cell as claimed in claim 1, wherein the second doped region is coupled to a bit line.

4. The memory cell as claimed in claim 1, wherein the second doped region forms a parasitic transistor with the well region.

5. The memory cell as claimed in claim 4, wherein the parasitic transistor conducts when a potential of the floating gate reaches a predetermined level.

6. The memory cell as claimed in claim 4, wherein the parasitic transistor amplifies output signals of the memory cell.

7. The memory cell as claimed in claim 1, wherein the second doped region and the well region amplifies an output signal of the memory cell.

8. The memory cell as claimed in claim 4, wherein the parasitic transistor is a bipolar PNP transistor.

9. The memory cell as claimed in claim 1 further comprising a metal contact formed over the second doped region, wherein the metal contact is electrically coupled to the third region and isolated from the second doped region.

10. A non-volatile memory product formed on a semiconductor substrate, comprising:
    a memory cell including,
        a well region doped with a first-type dopant,
        a drain region having a first region doped with a first-type dopant and a second region doped with a second-type dopant, wherein
            the second region is contiguous with the well region, and
            the first region, the second region, and the well region are arranged to form a parasitic transistor inside the memory cell,
        a source region formed spaced-apart from the drain region and contiguous with the well region,
        a floating gate disposed over the well region, drain region and source region, and
        a control gate formed over the floating gate,
    wherein the memory cell attains a self-convergent state during programming of the memory cell.

11. The non-volatile memory product as claimed in claim 10, wherein the parasitic transistor amplifies an output from the memory cell.

12. The non-volatile memory product as claimed in claim 10, wherein the drain region of the memory cell is provided with a plurality of voltage levels to obtain a plurality of threshold voltages in the memory cell.

13. The non-volatile memory product as claimed in claim 12, wherein the plurality of threshold voltages obtain a plurality of self-convergent states in the memory cell during programming.

14. The non-volatile memory product as claimed in claim 10, wherein the source region and the well region are grounded during programming.

15. The non-volatile memory product as claimed in claim 10, wherein the control gate is coupled to a voltage source for providing a step function during programming.

16. A non-volatile memory product, comprising:
    a semiconductor substrate, including
        a well region implanted with a first-type dopant,
        a first doped region implanted with a second-type dopant, and
        a second doped region, formed spaced-apart from the first doped region, implanted with the second-type dopant, the second doped region including a third region implanted with the first-type dopant, wherein the second doped region, the third region, and the well region are arranged to form a parasitic transistor;
    a floating gate disposed over the semiconductor substrate and a portion of the second doped region;
    a control gate disposed over a portion of the floating gate;

the second doped region connectable to a first voltage source for providing a first voltage; and the control gate connectable to a second voltage source for providing a second voltage, wherein during programming of the memory cell, the first voltage is greater than the second voltage, and wherein upon reaching a predetermined programming level, the parasitic transistor conducts terminate programming.

17. The non-volatile memory product as claimed in claim 16, wherein the parasitic transistor conducts to discharge the first voltage to a level substantially equal to that of the second voltage to terminate programming.

18. The memory cell as claimed in claim 16, wherein the first voltage is a bit line voltage and the second voltage is a word line voltage.

* * * * *